(12) United States Patent  
Lowery

(10) Patent No.: US 7,049,159 B2
(45) Date of Patent: May 23, 2006

(54) STENCILING PHOSPHOR LAYERS ON LIGHT EMITTING DIODES

(75) Inventor: Christopher H. Lowery, Fremont, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/703,040

(22) Filed: Nov. 5, 2003

(65) Prior Publication Data

US 2004/0097006 A1   May 20, 2004

Related U.S. Application Data

(62) Division of application No. 09/688,053, filed on Oct. 13, 2000, now Pat. No. 6,650,044.

(51) Int. Cl.
*H01L 21/00* (2006.01)
*H01L 21/40* (2006.01)

(52) U.S. Cl. ............................. 438/22; 438/33; 438/82; 438/99

(58) Field of Classification Search ................. 438/33, 438/22, 99, 82
See application file for complete search history.

(56) References Cited

U.S. PATENT DOCUMENTS

| 4,774,435 A | 9/1988 | Levinson ..................... 313/509 |
| 4,897,319 A | 1/1990 | Sun ............................. 428/690 |
| 4,988,579 A | 1/1991 | Tomomura et al. ......... 428/690 |
| 5,072,301 A * | 12/1991 | Dziedzic ..................... 348/821 |
| 5,229,628 A | 7/1993 | Kobayashi et al. ......... 257/103 |
| 5,391,876 A | 2/1995 | Tsoukala et al. ......... 250/361 R |
| 5,471,113 A | 11/1995 | De Backer et al. ......... 313/487 |
| 5,813,753 A | 9/1998 | Vriens et al. ................ 362/293 |
| 5,959,316 A | 9/1999 | Lowery ........................ 257/98 |
| 5,998,925 A | 12/1999 | Shimizu et al. ............. 313/503 |
| 6,207,077 B1 | 3/2001 | Burnell-Jones ........ 252/301.36 |
| 6,245,259 B1 | 6/2001 | Höhn et al. ............ 252/301.36 |
| 6,252,254 B1 | 6/2001 | Soules et al. .................. 257/89 |
| 6,319,425 B1 | 11/2001 | Tasaki et al. .......... 252/301.36 |
| 6,351,069 B1 | 2/2002 | Lowery et al. .............. 313/512 |
| 6,373,188 B1 | 4/2002 | Johnson et al. ............. 313/506 |
| 6,404,125 B1 | 6/2002 | Garbuzov et al. .......... 313/499 |
| 6,413,790 B1 * | 7/2002 | Duthaler et al. .............. 438/21 |
| 2001/0015318 A1 * | 8/2001 | Rasmussen ................. 204/164 |

* cited by examiner

*Primary Examiner*—Chuong Anh Luu
(74) *Attorney, Agent, or Firm*—Patent Law Group LLP

(57) ABSTRACT

A method for forming a luminescent layer on a light emitting semiconductor device includes positioning a stencil on a substrate such that a light emitting semiconductor device disposed on the substrate is located within an opening in the stencil, depositing a stenciling composition including luminescent material in the opening, removing the stencil from the substrate, and curing the stenciling composition to a solid state. The resulting light emitting device includes a stack of layers including semiconductor layers comprising an active region and a luminescent material containing layer having a substantially uniform thickness disposed around at least a portion of the stack. A surface of the luminescent material containing layer not adjacent to the stack substantially conforms to a shape of the stack. In one embodiment, the light emitting device emits white light in a uniformly white spatial profile.

9 Claims, 6 Drawing Sheets

STENCILING PHOSPHOR LAYERS ON LIGHT EMITTING DIODES

CROSS REFERENCE TO RELATED APPLICATIONS

This application is a division of application Ser. No. 09/688,053, filed Oct. 13, 2000 now U.S. Pat. No. 6,650,044 and incorporated herein by reference.

BACKGROUND

1. Field of Invention

The present invention relates generally to light emitting devices and more particularly to light emitting diodes using phosphors.

2. Description of Related Art

Blue light emitting diodes (LEDs) are used with luminescent materials (phosphors) to produce light emitting devices which emit apparently white light. U.S. Pat. Nos. 5,813,753 and 5,998,925, for example, disclose light emitting devices in which a blue LED is disposed in a reflective cup and surrounded by material including phosphors. A portion of the blue light emitted by the LED is absorbed by the phosphors, which in response emit red and green light. The combination of the unabsorbed blue light emitted by the LED and the red and the green light emitted by the phosphors can appear white to the human eye. Unfortunately, such conventionally phosphor surrounded LEDs frequently emit white light in a central cone surrounded by annular rings of yellow and blue light, rather than emitting light in a uniformly white spatial profile.

Lowery U.S. Pat. No. 5,959,316, incorporated herein by reference, discloses that such annular rings of blue and yellow light can result from nonuniformity in the thickness of the phosphor containing material surrounding the LED and consequent spatially nonuniform absorption of blue light and emission of red and green light. In particular, thick regions of phosphor containing material absorb more blue light and emit more red and green light than do thin regions of phosphor containing material. The thick regions thus tend to appear yellow, and the thin regions tend to appear blue. Lowery also discloses that deposition of a transparent spacer over and around the LED prior to deposition of a uniform thickness of phosphor containing material can eliminate the annular rings in the emission profile. However, surface tension makes the shape and thickness of the phosphor containing material, typically deposited as a liquid or paste (solids dispersed in a liquid), difficult to control.

What is needed is a method for uniformly coating an LED with phosphor containing material.

SUMMARY

A method for forming a luminescent layer on a light emitting semiconductor device includes positioning a stencil on a substrate such that a light emitting semiconductor device disposed on the substrate is located within an opening in the stencil, depositing a stenciling composition including luminescent material in the opening, removing the stencil from the substrate, and curing the stenciling composition to a solid state. In one embodiment, the shape of the opening in the stencil substantially conforms to the shape of the light emitting semiconductor device, the depth of the opening is about equal to a sum of a height of the light emitting semiconductor device and a thickness of the luminescent layer, and a width of the opening is about equal to a sum of a width of the light emitting semiconductor device and twice a thickness of the luminescent layer.

In one embodiment, the stencil is positioned such that each one of a plurality of light emitting semiconductor devices disposed on the substrate is located within a corresponding one of a plurality of openings in the stencil. Stenciling composition is deposited in each of the openings.

Luminescent layers are formed on light emitting semiconductor devices without contaminating adjacent areas of the substrate and without completely covering, for example, substrate electrical contacts. Thus, wire bonding of such contacts can occur subsequent to the formation of the luminescent layers. In addition, since many light emitting devices can be disposed on a single substrate and simultaneously stenciled with luminescent material containing layers, this method results in a high throughput and is thus cost effective.

In one embodiment, the luminescent stenciling composition includes phosphor particles and silica particles dispersed in an optically clear silicone polymer which can be cured by heat or light. Preferably, the uncured silicone polymer has a viscosity between about 1000 centistokes and 20000 centistokes and the silica particles are fumed silica particles having a surface area per unit mass greater than about 90 m$^2$/g. The silica particles employed in this embodiment impart thixotropic properties to the luminescent stenciling composition. As a result, a layer formed from the uncured luminescent stenciling composition retains its shape after stenciling without collapsing or slumping. Once cured to a solid state, a layer formed from the luminescent stenciling composition exhibits sufficient strength to withstand subsequent processing of the light emitting semiconductor device on which it is formed. In addition, a cured layer of the luminescent stenciling composition formed in accordance with this embodiment is chemically and physically stable at temperatures in excess of 120° C. In particular, the cured layer of luminescent stenciling composition will not yellow during prolonged exposure to temperatures between about 120° C. and about 200° C.

A resulting light emitting device includes a stack of layers including semiconductor layers comprising an active region and a luminescent material containing layer having a substantially uniform thickness disposed around at least a portion of the stack. A surface of the luminescent material containing layer not adjacent to the stack substantially conforms to a shape of the stack. In one embodiment, the light emitting device includes, in addition, an optically transparent layer disposed between the luminescent material containing layer and the stack.

In one embodiment, the active region emits blue light, and the luminescent material containing layer includes phosphors that convert a portion of the blue light to light combinable with a remaining portion of the blue light to produce white light. In this embodiment, the light emitting device emits white light in a uniformly white spatial profile. In particular, the yellow and blue annular rings of conventionally phosphor surrounded white light devices are eliminated.

DETAILED DESCRIPTION

Figure 1:
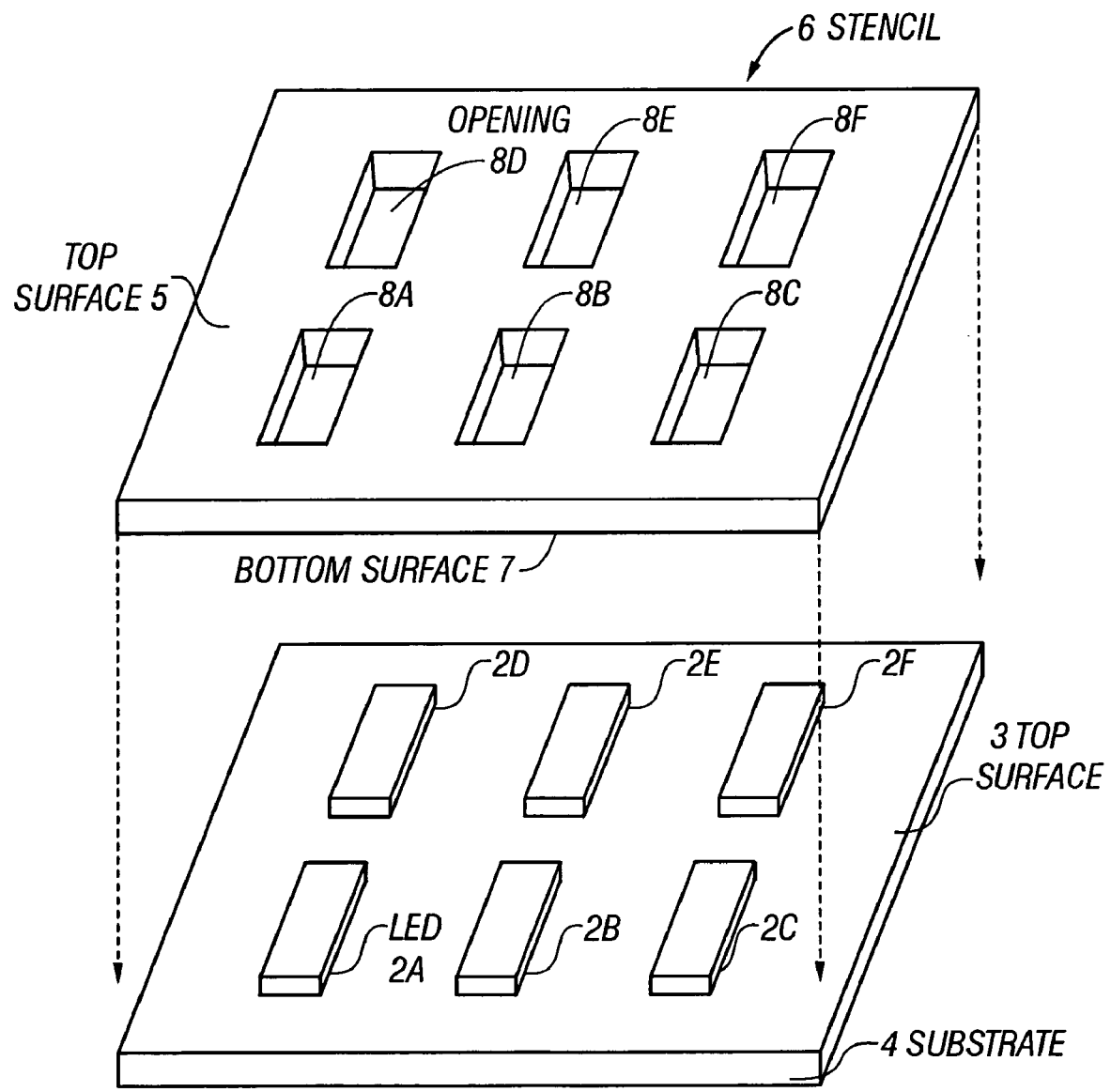
FIG. 1 is a schematic diagram of light emitting diodes disposed on a substrate and a corresponding stencil in accordance with an embodiment of the present invention.

In accordance with one embodiment of the present invention, phosphor containing material is stenciled onto light emitting diodes (LEDs). Referring to FIG. 1, in one embodiment, LEDs 2A–2F are disposed in a pattern on a top surface 3 of substrate 4. Though for clarity of illustration 6 LEDs are depicted in FIG. 1, more or fewer than 6 LEDs may be disposed on substrate 4. Stencil 6 has a top surface 5, a bottom surface 7, and openings 8A–8F passing through stencil 6 and corresponding in shape to LEDs 2A–2F. In one implementation, openings 8A–8F are distributed in stencil 6 in a pattern corresponding to the pattern of LEDs 2A–2F on substrate 4. In another implementation, the number of openings in stencil 6 is greater than the number of LEDs on substrate 4, and a subset of the openings in stencil 6 is distributed in a pattern corresponding to the pattern of LEDs 2A–2F.

Stencil 6 is formed, for example, from a stainless steel sheet. The thickness of stencil 6 measured perpendicular to its planar surfaces (depth of openings 8A–8F) is equal to the sum of the height of an LED 2A–2F measured perpendicular to substrate 4 and the approximate desired thickness of a phosphor containing material to be disposed above LEDs 2A–2F. Similarly, the length or width of an opening 8A–8F is equal to the sum of the corresponding length or width of an LED 2A–2F and approximately twice the desired thickness of phosphor containing material to be disposed around LEDs 2A–2F.

Figure 2:
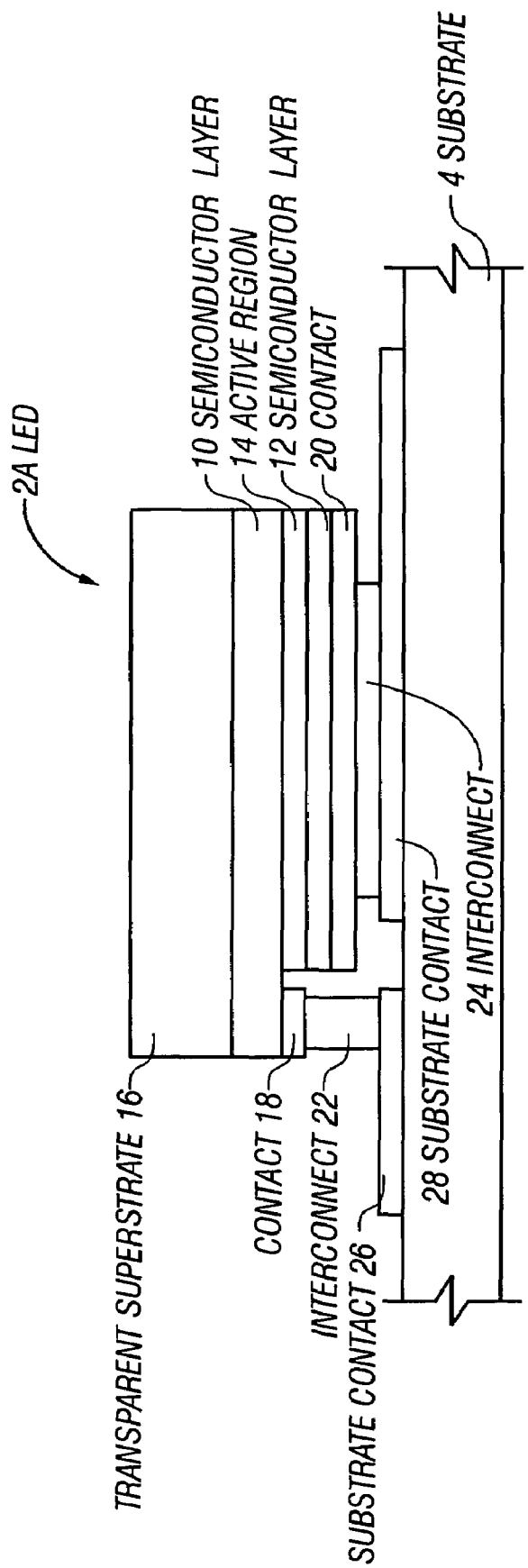
FIG. 2 is a schematic diagram of a light emitting diode to be stenciled with phosphor containing material in accordance with an embodiment of the present invention.

In one embodiment, LEDs 2A–2F are flip-chip geometry LEDs such as LED 2A illustrated in FIG. 2. Like reference numbers in the various figures designate same parts in the various embodiments. LED 2A includes a first semiconductor layer 10 of a first conductivity type and a second semiconductor layer 12 of a second conductivity type. Semiconductor layers 10 and 12 are electrically coupled to active region 14. Active region 14 is, for example, a p-n junction associated with the interface of layers 10 and 12. Alternatively, active region 14 includes one or more semiconductor layers that are doped n-type or p-type or are undoped. Optional transparent superstrate 16 is disposed on semiconductor layer 10. Contacts 18 and 20 are electrically coupled to semiconductor layers 10 and 12, respectively. Active region 14 emits light upon application of a suitable voltage across contacts 18 and 20. Interconnects 22 and 24 electrically couple contacts 18 and 20 to substrate contacts 26 and 28, respectively.

In one implementation, semiconductor layers 10 and 12 and active region 14 are formed from III-Nitride compounds such as $Al_xIn_yGa_{1-x-y}N$ compounds, and active region 14 emits blue light at a wavelength of, for example, about 470 nm. Optional transparent superstrate 16 is formed, for example, from sapphire or silicon carbide. Substrate 4 comprises silicon, for example.

Although FIG. 2 illustrates a particular LED structure, the present invention is independent of the number of semiconductor layers in LED 2A and independent of the detailed structure of active region 14. It should be noted that dimensions of the various elements of LED 2A illustrated in the various figures are not to scale.

In contrast to flip-chip geometry LEDs, conventional geometry LEDs typically have one or more wirebonds electrically coupling electrodes on the surface of the LED facing away from the substrate (the top surface) to contacts on the substrate. These wirebonds, which are typically fragile, obstruct access to the top surface of the LED. Though phosphor containing material can be stenciled onto such conventional geometry light emitting diodes in accordance with the present invention, care must be taken to avoid damaging the wirebonds. Since flip-chip geometry LEDs such as LED 2A in FIG. 2 lack such wirebond connections to their top surfaces, they are more easily stenciled with phosphor containing material.

Figure 3A:
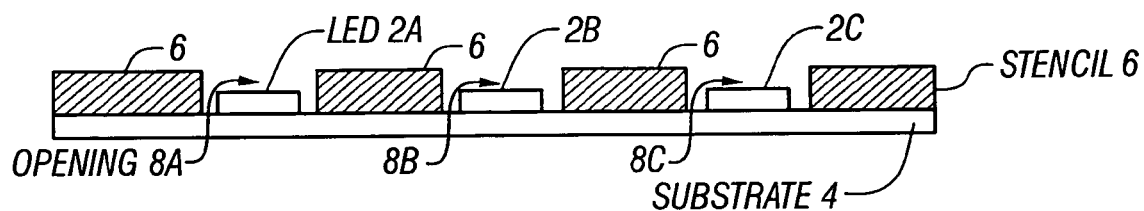
FIGS. 3A–3C are schematic side views of light emitting diodes disposed on a substrate corresponding to three steps of a stenciling process in accordance with an embodiment of the present invention.
Figure 3B:
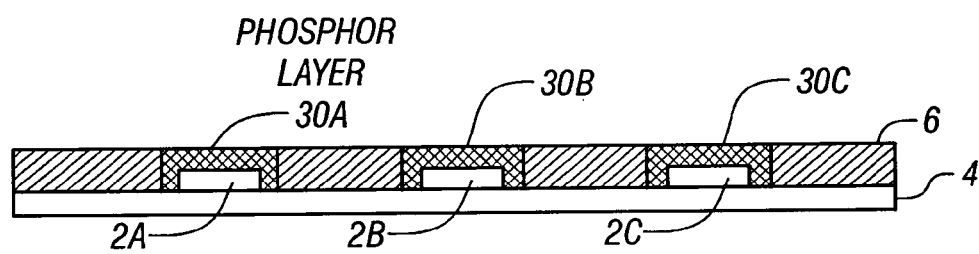
Figure 3C:
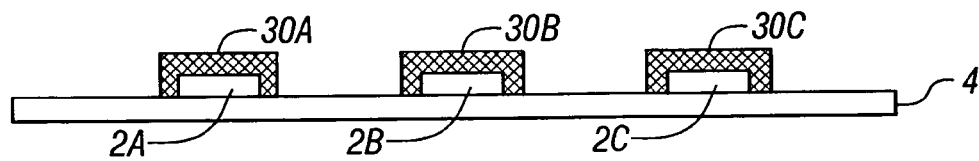

Referring again to FIG. 1, stencil 6 is positioned on substrate 4 such that openings 8A–8F are aligned with LEDs 2A–2F and bottom surface 7 of stencil 6 is in contact with top surface 3 of substrate 4. As shown in the side view of stencil 6 positioned on substrate 4 illustrated in FIG. 3A, LEDs 2A–2C, for example, are located approximately centered in corresponding openings 8A–8C in stencil 6. Next, a curable luminescent stenciling composition, such as the phosphor containing stenciling composition described below, is disposed in openings 8A–8F in stencil 6. In one implementation, the stenciling composition is disposed in openings 8A–8F of stencil 6 with a metal blade drawn across surface 5. Stencil 6 is then removed from substrate 4, leaving stenciled phosphor layers, such as phosphor layers 30A–30C illustrated in FIGS. 3B and 3C, disposed over and around LEDs 2A–2F.

In one implementation, the steps of positioning stencil 6 on substrate 4, disposing a luminescent stenciling composition on surface 5 and in openings 8A–SF to form phosphor layers such as phosphor layers 30A–30C on LEDs 2A–2F, and removing stencil 6 from substrate 4 are performed by a conventional high precision stenciling machine typically used to stencil solder paste onto printed circuit boards. The stenciling machine is, for example, an Ultraprint 1500 manufactured by MPM Corporation of Franklin, Mass.

After stencil 6 is removed from substrate 4, the phosphor layers on LEDs 2A–2F are cured to a solid state by, for example, application of heat or ultraviolet radiation. The curing process can involve, for example, cross-linking of polymeric material in the phosphor layers. In one implementation, LEDs 2A–2C, for example, are heated to about 100° C. in a conventional oven for about 10 minutes to cure phosphor layers 30A–30C.

Figure 4:
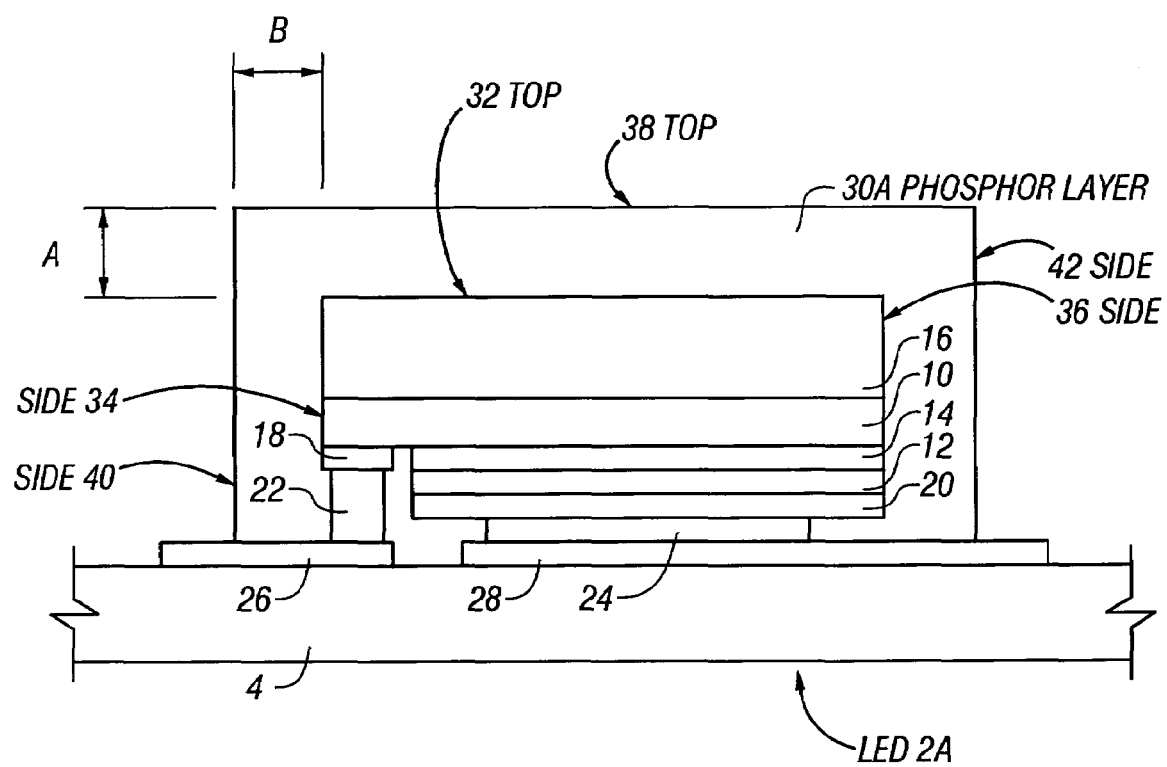
FIG. 4 is a schematic diagram of a light emitting diode having a phosphor containing layer in accordance with an embodiment of the present invention.

The resulting LED 2A, for example, having phosphor layer 30A in accordance with one embodiment is schematically illustrated in FIG. 4. Phosphor layer 30A has a substantially uniform thickness above top surface 32 and adjacent to vertical sides 34 and 36 of LED 2A. Also, top surface 38 and vertical side surfaces 40 and 42 of phosphor layer 30A are substantially parallel to top surface 32 and vertical side surfaces 34 and 36, respectively, of LED 2A. Thus, outer surfaces of phosphor layer 30A, such as surfaces 38, 40, and 42, substantially conform to the shape of LED 2A. Dimensions of phosphor layer 30A denoted A and B both range from about 50 microns (μm) to about 250 μm.

After the phosphor layers on LEDs 2A–2F are cured, substrate 4 is sawn or scribed to separate LEDs 2A–2F into discrete devices (dice).

In one embodiment, LEDs 2A–2F having conforming phosphor layers 30A–30F of substantially uniform thickness emit light in a uniformly white spatial profile. In particular, the yellow and blue annular rings of conventionally phosphor surrounded white light devices are eliminated. Moreover, phosphor layers 30A–30F can be disposed on LEDs 2A–2F without contaminating adjacent areas of substrate 4 and without completely covering substrate contacts such as contacts 26 and 28 of LED 2A. Thus, wire bonding of, for example, contacts 26 and 28 can occur subsequent to the formation of phosphor layer 30A. In addition, since many LEDs can be disposed on a single substrate and simultaneously stenciled with phosphor layers, the stenciling process described above is a high-throughput and cost effective process.

The phosphor layers on LEDs 2A–2F must substantially retain their stenciled shapes, without collapsing or slumping, until cured. In addition, it is desirable that the phosphor layers withstand operating temperatures exceeding about 120° C. for long periods of time without change in their chemical or physical properties. Epoxies, urethanes, and similar organic resins, for example, are unsuitable for use in the phosphor layers, because at temperatures exceeding about 120° C. they oxidize and become yellow. The yellow organic resins then absorb blue light emitted from the LED, degrading the performance of the device. The apparent color of a device intended to emit white light, for example, would shift toward yellow as the organic resins oxidized.

A luminescent stenciling composition suitable for use in accordance with an embodiment of the present invention is prepared as follows. First, a phosphor powder is mixed with a conventional curable silicone polymer composition. The curable silicone polymer composition includes at least one polymer having a chemical structure that includes alternating silicon and oxygen atoms (a silicone polymer), and optionally includes a curing agent such as a catalyst that catalyzes cross-linking of silicone polymers or a photopolymerization initiator. The curable silicone polymer composition is preferably substantially nonabsorbing and nonscattering (optically clear) for wavelengths of light from about 400 nm to about 600 nm. The uncured stenciling composition should have a viscosity greater than about 1,000 centistokes if it is to retain its stenciled shape until it is cured, and if the phosphor particles are to remain in suspension rather than sediment out, but less than about 20,000 centistokes if it is to be easily stenciled. Consequently, the curable silicone polymer composition preferably has a viscosity, before curing, of about 1,000 centistokes to about 20,000 centistokes. In addition, the curable silicon polymer composition preferably has a refractive index greater than about 1.45, in order to increase the efficiency with which light is coupled out of the LED and out of the phosphor particles into the stenciling composition. Also, the curable silicone polymer composition is preferably stable as a liquid at room temperature until cured to a solid state by, for example, heating or exposure to ultraviolet light.

Suitable curable silicone polymer compositions are commercially available. In one implementation, for example, the curable silicone polymer composition is a conventional two part thermally curable silicone polymer composition, available from Nye Lubricants, Inc. of Fairhaven, Mass., having a viscosity of about 1300 centistokes and curing in about 10 minutes at 100° C. and in about two weeks at room temperature.

In one implementation, the phosphor powder mixed with the conventional curable silicone composition is a powder of $(Y,Gd)_3Al_5O_{12}$:Ce (gadolinium and cerium doped yttrium aluminum garnet) particles available as product number QUMK58/F from Phosphor Technology Ltd., Nazeing, Essex, England. Particles of this phosphor material have a typical diameter of about 1 micron ($\mu$m) to about 5 $\mu$m, absorb light of wavelengths from about 430 nanometers (nm) to about 490 nm, and emit light in a broad band from about 510 nm to about 610 nm. The color of light emitted by an LED having a stenciled phosphor layer is determined, in part, by the concentration of phosphor particles in the luminescent stenciling composition. Typically, the phosphor particles are mixed with the curable silicone polymer composition at concentrations ranging from about 20 grams of phosphor particles per 100 grams of silicone polymer composition to about 120 grams of phosphor particles per 100 grams of silicone polymer composition.

In one embodiment, titanium dioxide particles are also dispersed in the silicone polymer composition at a concentration of about 1.5 grams of titanium dioxide per 100 grams of silicone polymer composition to about 5.0 grams of titanium dioxide per 100 grams of silicone polymer composition. The titanium dioxide particles, which are approximately the same size as the phosphor particles, increase the scattering of light emitted by active region 14 and thus increase the absorption of that light by the phosphor particles. The overall conversion efficiency of the LED declines, however, with increasing titanium oxide concentration.

Next, after the phosphor particles and optional titanium dioxide particles are mixed with the curable silicone composition, finely divided silica particles are dispersed in the mixture to form a thixotropic gel. A thixotropic gel exhibits thixotropy, i.e., an apparent drop in viscosity when subjected to shear and a return to the original viscosity level when the shear force is removed. Consequently, a thixotropic gel behaves as a fluid when shaken; stirred, or otherwise disturbed and sets again to a gel when allowed to stand. Thus, a luminescent stenciling composition prepared in accordance with an embodiment of the present invention behaves as a fluid as it is stenciled onto an LED, but forms on the LED a phosphor containing layer that, if undisturbed, retains its shape after the stencil has been removed.

In one embodiment, the silica particles are particles of fumed silica, a colloidal form of silica made by combustion of chlorosilanes in a hydrogen-oxygen furnace. Fumed silica is chemically and physically stable at temperatures exceeding 120° C., transparent to visible light, and will impart satisfactory thixotropic properties to the luminescent stenciling composition at comparatively low concentrations. The grade of fumed silica used is chosen to be compatible with non-polar materials. In one implementation, the fumed silica is M-5P grade CAB-O-SIL® untreated amorphous fumed silica obtained from Cabot Corporation of Boston, Mass. This grade of fumed silica is hydrophobic and has an average surface area per unit mass of 200±15 $m^2$/g. The M-SP grade fumed silica particles are dispersed in the mixture of phosphor particles and silicone polymer composition with a conventional three roll mill at concentrations of about 1.5 grams of fumed silica per 100 grams of silicone polymer composition to about 4.5 grams of fumed silica per 100 grams of silicone polymer composition. As the concentration of fumed silica is increased, the stenciling composition becomes more thixotropic, i.e. more solid-like as an undisturbed gel.

Other implementations use fumed silica having a surface area per unit mass either greater than or less than 200±15 m²/g. For fixed concentrations of fumed silica, stenciling compositions become more thixotropic as the surface area per unit mass of the fumed silica is increased. Thus, fumed silicas having lower surface area per unit mass must be used at higher concentrations. The required high concentrations of low surface area per unit mass fumed silicas can result in stenciling compositions having viscosities that are too high to be easily stenciled. Consequently, the fumed silica preferably has a surface area per unit mass greater than about 90 m²/g. In contrast, as the surface area per unit mass of the fumed silica is increased, the required concentration of fumed silica decreases, but the fumed silica becomes more difficult to disperse in the silicone polymer composition.

Figure 5:
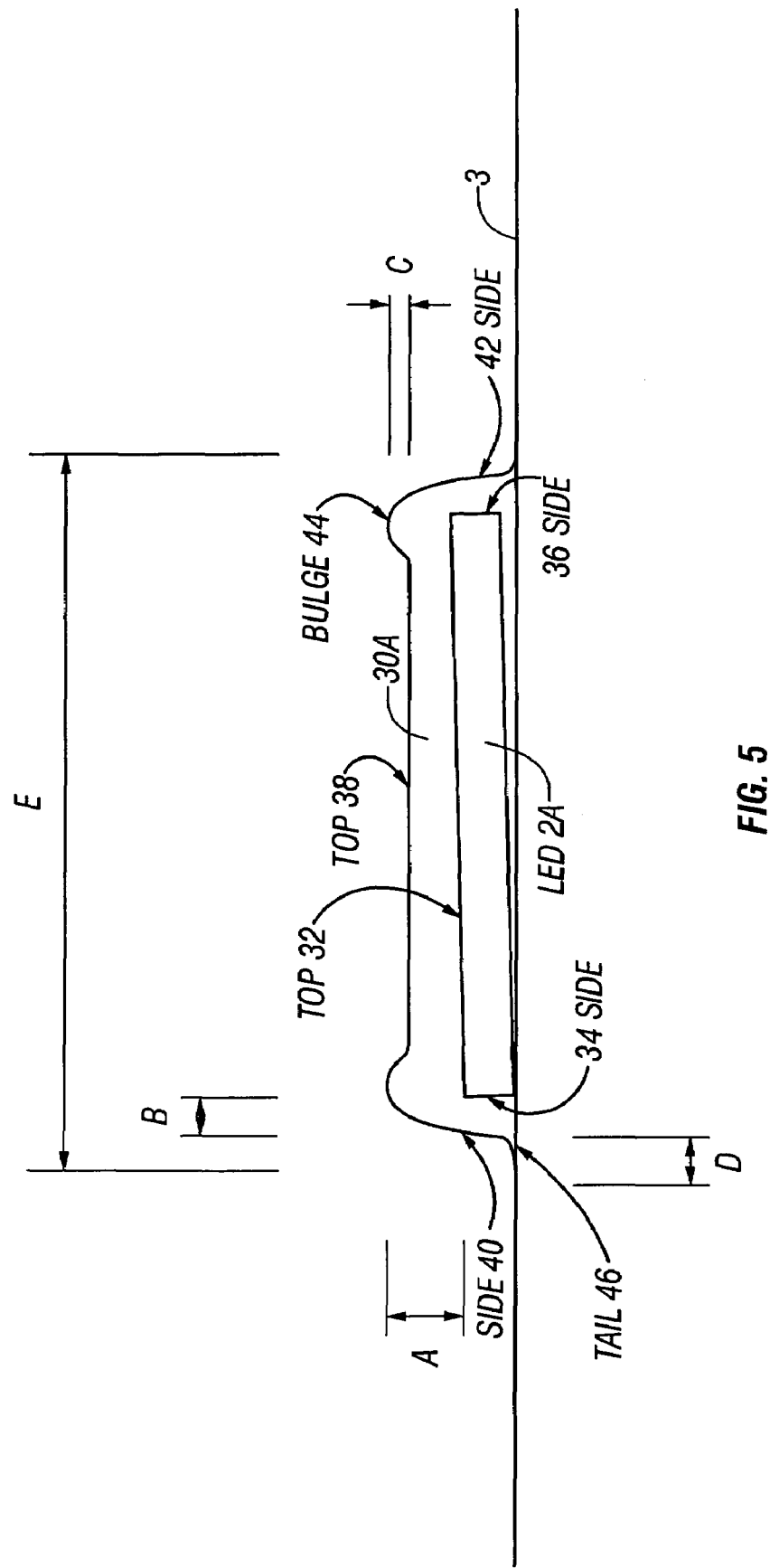
FIG. 5 illustrates a superposition of a typical measured profile of a stenciled phosphor containing layer and a profile of a typically oriented flip chip geometry light emitting diode mounted on a substrate.

FIG. 5 illustrates a superposition of a typical measured profile of a stenciled phosphor containing layer 30A and a profile of a typically oriented flip chip geometry LED 2A disposed on a top surface 3 of a substrate. For convenience, like reference numbers are used for same parts in the measured profiles of FIG. 5 and the schematic illustration of FIG. 4. Phosphor containing layer 30A illustrated in FIG. 5 was formed as described above with a luminescent stenciling composition including a curable silicone polymer composition having a viscosity of about 1300 centistokes, $(Y,Gd)_3Al_5O_{12}$:Ce phosphor particles at a concentration of about 70 grams of phosphor particles per 100 grams of silicone polymer composition, and fumed silica particles having a surface area per unit mass of 200±15 m²/g at a concentration of about 3.5 grams of fumed silica particles per 100 grams of silicone polymer composition. The profile of phosphor layer 30A was measured using a conventional tool maker's microscope. The typical orientation of LED 2A was established by measuring, with a conventional profilometer, the profiles of several uncoated LEDs conventionally mounted on a silicone substrate.

As in the schematic illustration of FIG. 4, phosphor layer 30A in FIG. 5 is of substantially uniform thickness and substantially conforms to the shape of LED 2A. In particular, top and side surfaces 38, 40 and 42 of phosphor layer 30A are substantially parallel to top and side surfaces 32, 34, and 36, respectively, of LED 2A. In addition, phosphor layer 30A in FIG. 5 exhibits bulge 44 and tail 46 which form as or after the stencil is removed but before the luminescent stenciling composition is cured. Dimensions denoted by letters A–E are: A~90 μm, B~60 μm, C~30 μm, D~80 μm, E~1.31 millimeters (mm). Dimensions A–E are typically reproducible to ±5%. Dimension B is reproducible to ±2%, ±12 μm overall, if the stenciling process is implemented with a stenciling machine equipped with automatic pattern recognition software.

The concentration and grade of fumed silica used in the stenciling composition from which phosphor later 30A illustrated in FIG. 5 was formed were chosen to minimize bulge 44 and t ii 46. If the concentration of fumed silica in the stenciling composition were increased, then the height of bulge 44 would increase and the length of tail 46 would decrease. Alternatively, if the concentration of fumed silica were decreased, then the height of bulge 44 would decrease, the length of tail 46 would increase, and sides 40 and 42 of phosphor layer 30A would slump such that dimesion B was much smaller near top 32 of LED 2A than near substrate 4, and dimension A was much smaller near the edges of top 32 than near the center of top 32.

Figure 6:
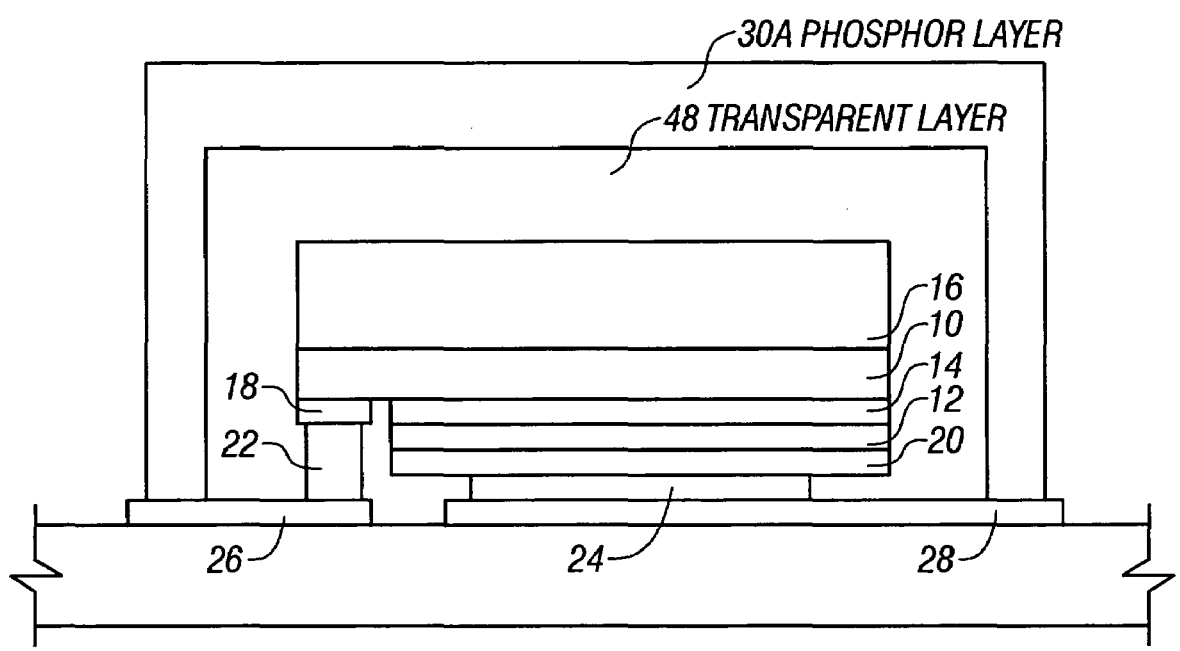
FIG. 6 is a schematic diagram of a light emitting diode having an optically transparent layer and a phosphor containing layer in accordance with an embodiment of the present invention.

Referring to FIG. 6, in another embodiment an optically transparent layer 48 is deposited on and around LED 2A, for example, prior to the deposition of stenciled phosphor containing layer 34. In one implementation, optically transparent layer 48 is formed using the stenciling process discussed above from an optically transparent stenciling composition. A suitable optically transparent stenciling composition is prepared in essentially the same manner as the luminescent stenciling composition described above, but without the addition of phosphor particles. Optically transparent layer 48 has a thickness of about 45 μm to about 80 μm. Both optically transparent layer 48 and phosphor containing layer 30A are of substantially uniform thickness and substantially conform to the shape of LED2A.

While the present invention is illustrated with particular embodiments, the invention is intended to include all variations and modifications falling within the scope of the appended claims. For example, the luminescent stenciling composition can include semiconductor nanocrystals and/or dye molecules in addition to or instead of phosphor particles.

What is being claimed is:

1. A method for forming a luminescent layer on a light emitting semiconductor device, the method comprising:
   positioning a stencil on a substrate such that a light emitting semiconductor device disposed on said substrate is located within an opening in said stencil;
   depositing a stenciling composition including luminescent material in said opening;
   removing said stencil from said substrate; and
   curing said stenciling composition to a solid state.

2. The method of claim 1, wherein said opening substantially conforms to a shape of said light emitting semiconductor device.

3. The method of claim 1, wherein a depth of said opening is about equal to a sum of a height of said light emitting semiconductor device and a thickness of said luminescent layer.

4. The method of claim 1, wherein a width of said opening is about equal to a sum of a width of said light emitting semiconductor device and twice a thickness of said luminescent layer.

5. The method of claim 1, wherein said stenciling composition comprises fumed silica particles and at least one silicone polymer.

6. The method of claim 5, wherein said fumed silica particles have a ratio of surface area per unit mass greater than about 90 m²/g.

7. The method of claim 5, wherein said silicone polymer has a viscosity of about 1,000 centistokes to about 20,000 centistokes.

8. The method of claim 1, further comprising:
   positioning said stencil such that each one of a plurality of light emitting semiconductor devices disposed on the substrate is located within a corresponding one of a plurality of openings in the stencil; and
   depositing the stenciling composition in each of said openings.

9. The method of claim 5, wherein a concentration by weight of said fumed silica particles is about 1:70 to about 1:20 with respect to said silicone polymer.

* * * * *